United States Patent
Lee

(10) Patent No.: US 7,763,524 B2
(45) Date of Patent: Jul. 27, 2010

(54) METHOD FOR FORMING ISOLATION STRUCTURE OF DIFFERENT WIDTHS IN SEMICONDUCTOR DEVICE

(75) Inventor: Nam-Jae Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 89 days.

(21) Appl. No.: 11/823,774

(22) Filed: Jun. 28, 2007

(65) Prior Publication Data

US 2008/0176379 A1    Jul. 24, 2008

(30) Foreign Application Priority Data

Oct. 31, 2006    (KR) ...................... 10-2006-0106767

(51) Int. Cl.
*H01L 21/762*    (2006.01)
(52) U.S. Cl. ...................... 438/427; 438/424; 438/435; 257/E21.54; 257/E21.545
(58) Field of Classification Search .................. 438/400, 438/424, 427, 435; 257/E21.537, E21.54, 257/E21.545, E21.546, E21.548
See application file for complete search history.

(56) References Cited

U.S. PATENT DOCUMENTS

| | | | | |
|---|---|---|---|---|
| 6,124,183 A | * | 9/2000 | Karlsson et al. | 438/427 |
| 6,335,235 B1 | * | 1/2002 | Bhakta et al. | 438/221 |
| 6,667,223 B2 | * | 12/2003 | Seitz | 438/427 |
| 6,821,865 B2 | * | 11/2004 | Wise et al. | 438/435 |
| 2005/0151190 A1 | * | 7/2005 | Kotek et al. | 257/341 |
| 2008/0014711 A1 | * | 1/2008 | Choi et al. | 438/424 |
| 2008/0020534 A1 | * | 1/2008 | Culmsee et al. | 438/296 |

FOREIGN PATENT DOCUMENTS

| | | |
|---|---|---|
| KR | 1020010081154 | 8/2001 |
| KR | 1020050003061 | 1/2005 |
| KR | 1020050122641 | 12/2005 |

* cited by examiner

*Primary Examiner*—Matthew Smith
*Assistant Examiner*—Michele Fan
(74) *Attorney, Agent, or Firm*—Blakely, Sokoloff, Taylor & Zafman LLP

(57) ABSTRACT

A method for forming an isolation structure in a semiconductor device including a substrate having a first region and a second region, the second region having an isolation structure formed to a larger width than a plurality of isolation structures formed in the first region, is provided. The method includes etching portions of the first and second regions of the substrate to form first and second trenches, wherein a width of the second trench is larger than that of the first trench, forming a first insulation layer to fill a portion of the first and second trenches, forming a barrier layer to fill the first and second trenches, etching portions of the first insulation layer and the barrier layer in the first region, removing the barrier layer, and forming a second insulation layer over the first insulation layer.

18 Claims, 6 Drawing Sheets

METHOD FOR FORMING ISOLATION STRUCTURE OF DIFFERENT WIDTHS IN SEMICONDUCTOR DEVICE

CROSS-REFERENCE TO RELATED APPLICATIONS

The present invention claims priority of Korean patent application number 10-2006-0106767, filed on Oct. 31, 2006, which is incorporated by reference in its entirety.

BACKGROUND OF THE INVENTION

The present invention relates to a method for fabricating a semiconductor device, and more particularly, to a method for fabricating a semiconductor memory device. In more detail, the present invention relates to a method for forming an isolation structure in a flash memory device which is a non-volatile memory device.

The size of semiconductor devices has decreased as the semiconductor fabrication technology has improved. Accordingly, the size of active regions and field regions in a semiconductor device has also decreased. Thus, an aspect ratio of a trench formed in the field region has increased to secure an isolation characteristic in a semiconductor device in which an isolation structure is formed by performing a shallow trench isolation (STI) process. Consequently, it has become difficult to fill gaps in a uniformly formed isolation structure without generating a void using a single layer of a high density plasma (HDP) oxide layer, which is a typical isolation structure material, in a highly integrated semiconductor memory device smaller than 100 nm.

Thus, the trench is filled using a polysilazane (PSZ) layer, together with the solely used typical HDP oxide layer to improve a gap-fill characteristic of such isolation structure. The PSZ layer is a type of a spin on dielectric (SOD) layer formed by a spin coating method.

FIGS. 1A to 1F illustrate cross-sectional views of a typical method for forming an isolation structure in a semiconductor device using an HDP oxide layer and a PSZ layer. For instance, a typical method for forming an isolation structure in a flash memory device, which is a non-volatile memory device, is described. A cell region 'CELL' represents a region where a memory cell will be formed, and a peripheral region 'PERIPHERAL' represents a region where driving devices for driving the memory cell will be formed. At this time, a pattern density of the cell region is greater than that of the peripheral region.

Referring to FIG. 1A, a tunnel oxide-based pattern 11, a polysilicon pattern 12, and a pad nitride-based pattern 13 are formed over a substrate 10. In more detail, a tunnel oxide-based layer, a polysilicon layer for forming a floating gate, and a pad nitride-based layer are formed over the substrate 10 including the cell region and the peripheral region.

A hard mask 14 is formed over the pad nitride-based layer. The pad nitride-based layer, the polysilicon layer, the tunnel oxide-based layer, and the substrate 10 are etched using the hard mask 14 to form trenches (not shown) having a certain depth. Thus, the tunnel oxide-based pattern 11, the polysilicon pattern 12, and the pad nitride-based pattern 13 are formed. A first HDP oxide layer 15 is formed over the resultant structure to fill a portion of the trenches.

Referring to FIG. 1B, a PSZ layer 16 is formed to a large thickness over the first HDP oxide layer 15 such that the trenches are sufficiently filled.

Referring to FIG. 1C, a chemical mechanical polish (CMP) process, is performed to polish the PSZ layer 16 and the first HDP oxide layer 15 to expose upper surfaces of the pad nitride-based pattern 13. Reference numerals 16A and 15A refer to a polished PSZ layer 16A and a polished first HDP oxide layer 15A. The hard mask 14 (FIG. 1B) formed over the pad nitride-based pattern 13 is removed together with portions of the PSZ layer 16 and the first HDP oxide layer 15 during the CMP process.

Referring to FIG. 1D, a wet etch process is performed to etch the polished PSZ layer 16A to a certain depth. Reference numeral 16B refers to a remaining PSZ layer 16B. Portions of the polished first HDP oxide layer 15A may be etched while etching the polished PSZ layer 16A. Reference numeral 15B refers to a remaining first HDP oxide layer 15B. Thus, the remaining PSZ layer 16B having a certain thickness is formed over the remaining first HDP oxide layer 15B, and portions of inner sidewalls of the trenches are exposed. The polished PSZ layer 16A is etched to the certain depth because it is more difficult to polish PSZ than HDP oxide. Forming a HDP oxide layer having a sufficient polish characteristic than PSZ over the remaining PSZ layer 16B results in a sufficient polish characteristic during a subsequent CMP process. Thus, a height difference caused by the CMP process may be minimized.

Referring to FIG. 1E, a second HDP oxide layer 17 is formed to a large thickness over the resultant structure to sufficiently fill the trenches.

Referring to FIG. 1F, a CMP process is performed to polish the second HDP oxide layer 17 until the upper surfaces of the pad nitride-based pattern 13 are exposed. Reference numeral 17A refers to a remaining second HDP oxide layer 17A. Consequently, an isolation structure 18 including the remaining first and second HDP oxide layers 15B and 17A and the remaining PSZ layer 16B is formed. Although not illustrated, a wet etch process using a phosphoric acid ($H_3PO_4$) solution is performed to remove the pad nitride-based pattern 13.

However, the typical method for forming the isolation structure in the flash memory device shows a difficulty in process control when etching the PSZ layer using the wet etch process. Such difficulty is generated because the PSZ layer is a porous material and it is generally difficult to control a time period of the wet etch process to obtain an adequate height. Thus, an effective field oxide height (EFH) of a subsequent isolation structure may be irregular.

SUMMARY OF THE INVENTION

Embodiments of the present invention are directed to provide a method for forming an isolation structure in a semiconductor device, which can allow easy process control when forming a highly integrated flash memory device and thus uniformly control an effective field oxide height (EFH) of the isolation structure.

The embodiments of the present invention are also directed to provide a method for forming an isolation structure in a semiconductor device, which can form a uniform isolation structure without generating voids when fabricating a highly integrated flash memory device.

In accordance with an aspect of the present invention, there is provided a method for forming an isolation structure in a semiconductor device, wherein the semiconductor device includes a substrate having a first region and a second region, the second region having an isolation structure formed to a larger width than a plurality of isolation structures formed in the first region, the method including: etching portions of the first and second regions of the substrate to form first and second trenches, wherein a width of the second trench is larger than that of the first trench; forming a first insulation layer to fill a portion of the first and second trenches; forming a barrier layer to fill the first and second trenches; etching portions of the first insulation layer and the barrier layer in the first region; removing the barrier layer; and forming a second insulation layer over the first insulation layer.

DESCRIPTION OF SPECIFIC EMBODIMENTS

Embodiments of the present invention relate to a method for forming an isolation structure in a semiconductor device.

FIGS. 2A to 2F illustrate cross-sectional views of a method for forming an isolation structure in a semiconductor device according to an embodiment of the present invention. In this embodiment, a method for forming an isolation structure in a flash memory device, which is a non-volatile memory device, is described as an example. A cell region 'CELL' represents a region where a memory cell will be formed, and a peripheral region 'PERIPHERAL' represents a region where driving devices for driving the memory cell will be formed. The cell region has a greater pattern density than the peripheral region. Accordingly, void generation often occurs in the cell region when forming an isolation structure. Thus, it is important to reduce the void generation in the cell region.

Figure 1A:
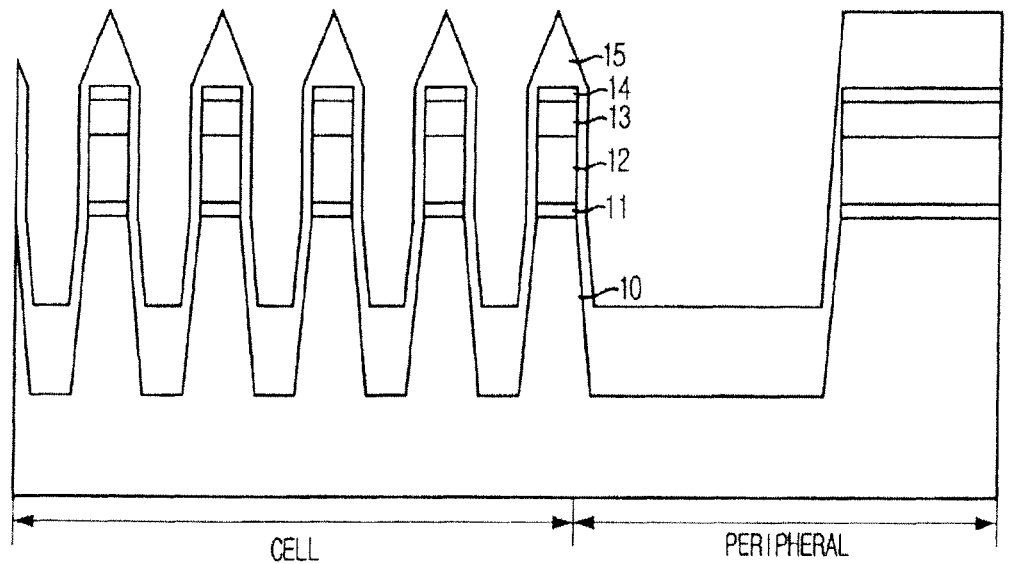
FIGS. 1A to 1F illustrate cross-sectional views of a typical method for forming an isolation structure in a semiconductor device using a high density plasma (HDP) oxide layer and a polysilazane (PSZ) layer.
Figure 1B:
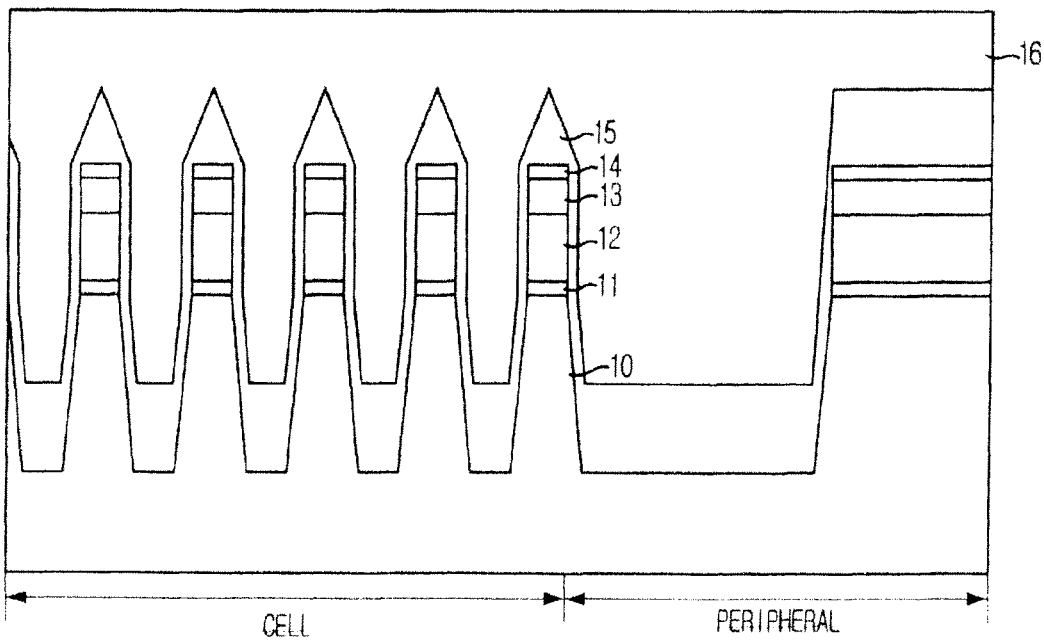
Figure 1C:
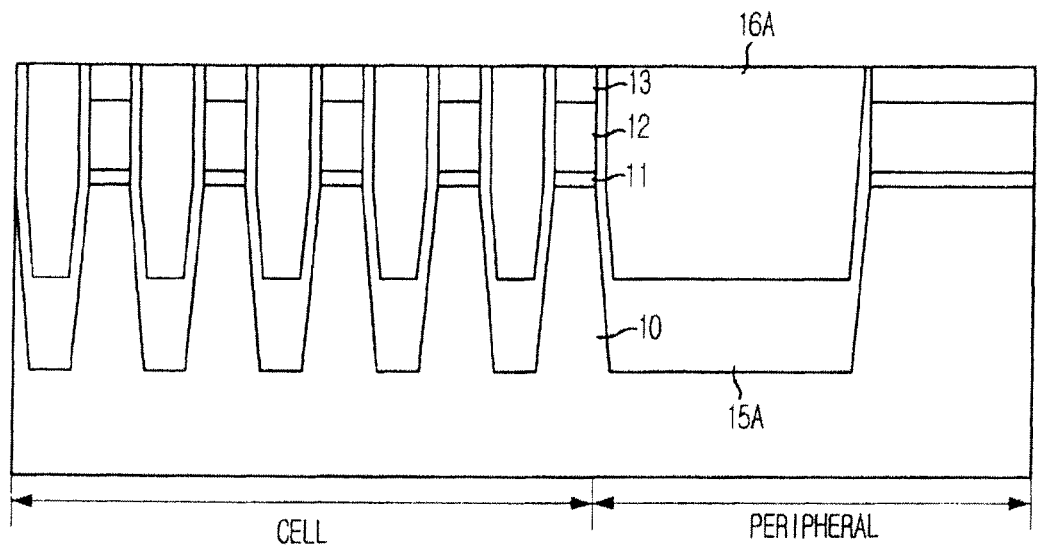
Figure 1D:
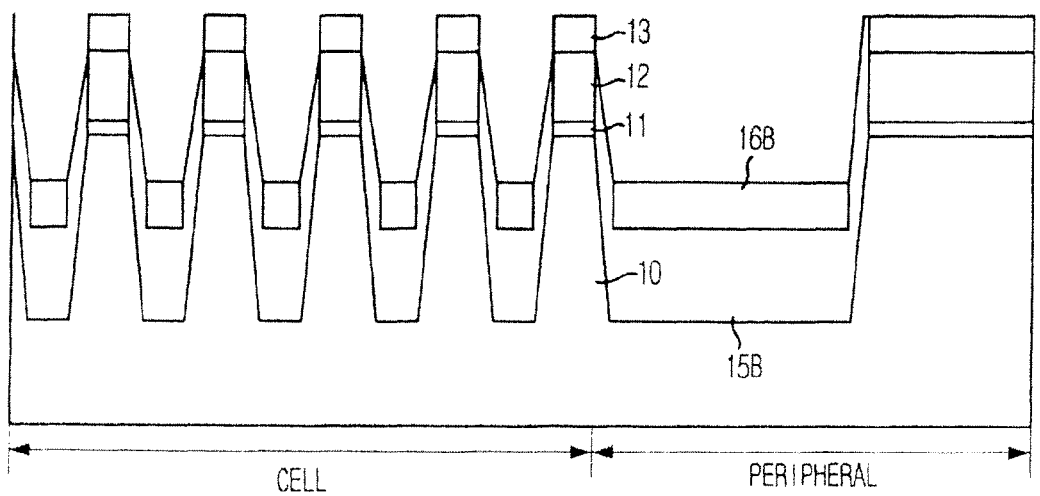
Figure 1E:
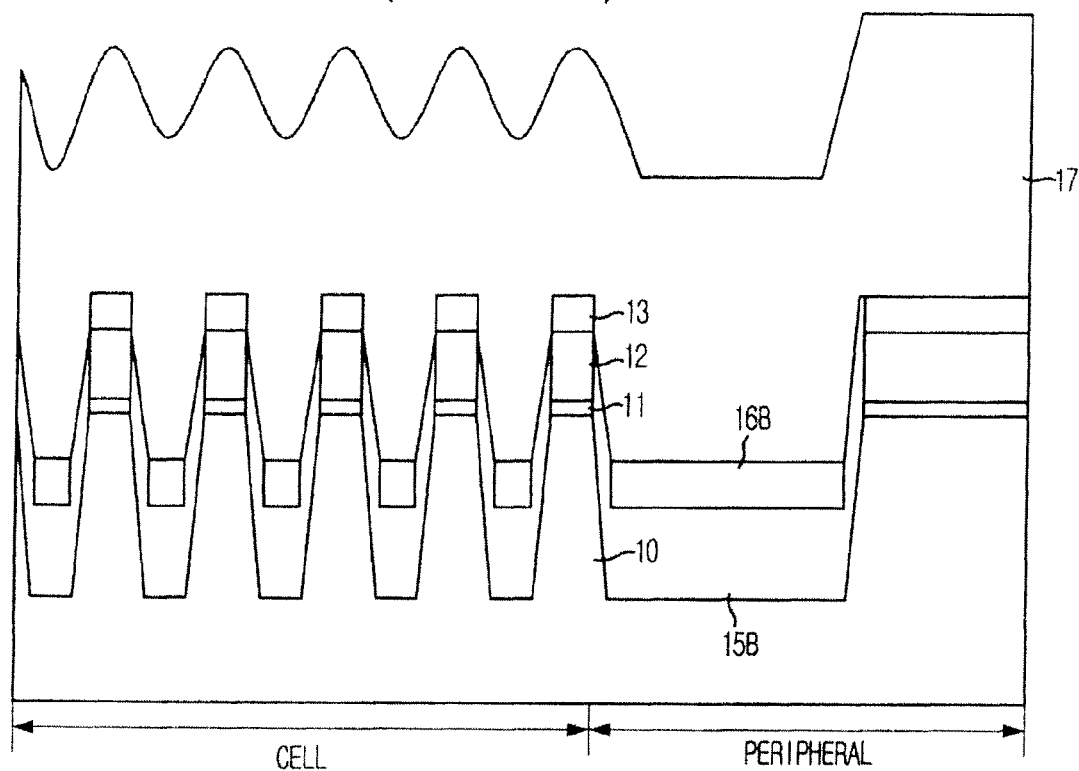
Figure 1F:
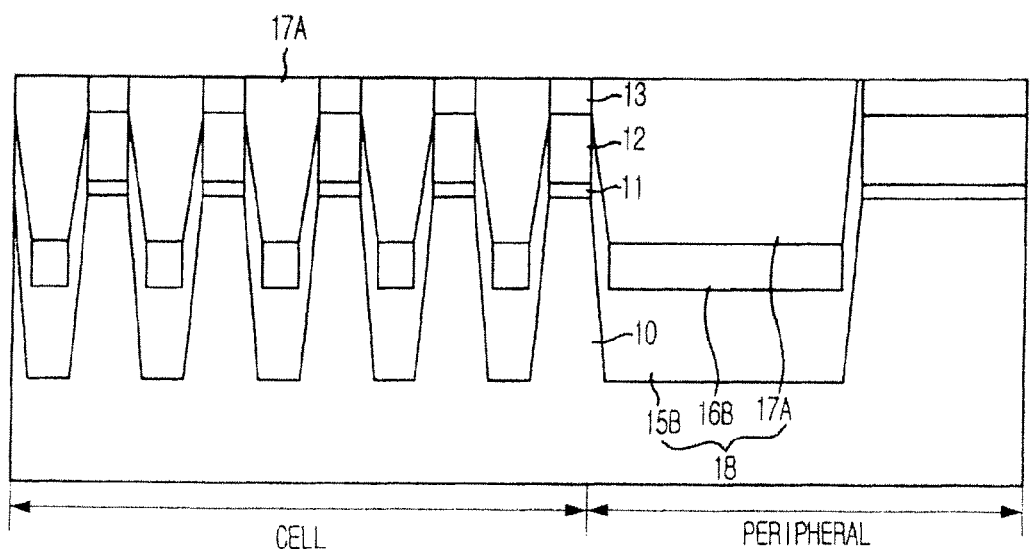
Figure 2A:
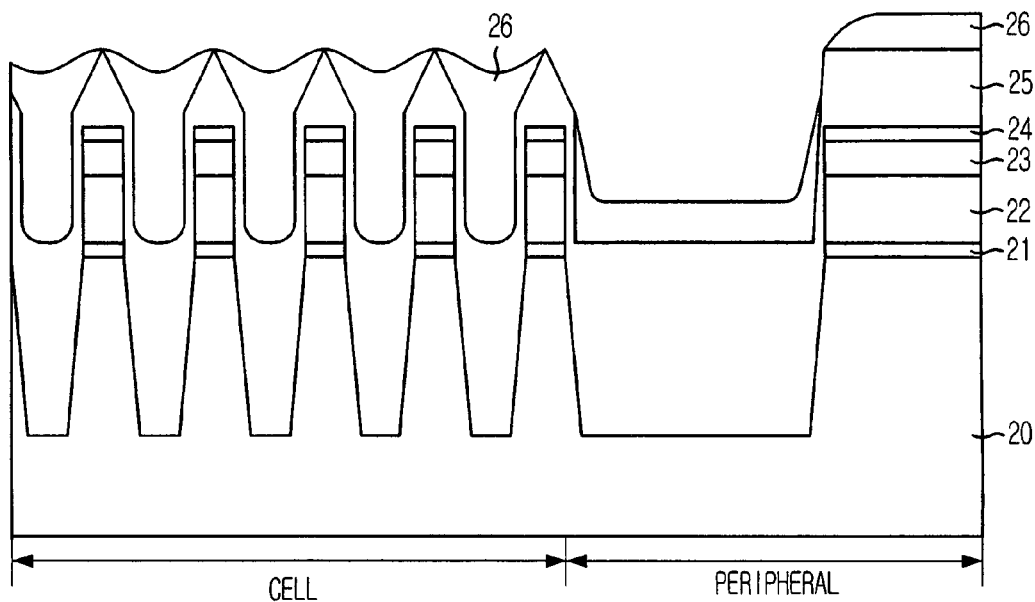
FIGS. 2A to 2F illustrate cross-sectional views of a method for forming an isolation structure in a semiconductor device according to an embodiment of the present invention.

Referring to FIG. 2A, a gate insulation pattern 21, a conductive pattern 22 for forming a floating gate, and a pad nitride-based pattern 23 are formed over a substrate 20. In more detail, a gate insulation layer, a conductive layer for forming a floating gate, and a padding layer are formed over the substrate 20 including the cell region 'CELL' and the peripheral region 'PERIPHERAL'. The padding layer includes a nitride-based material and thus is referred to as the pad nitride-based layer hereinafter. The gate insulation layer may include an oxide-based layer or an oxide-based material including nitride. The conductive layer may include a material with conductivity. For instance, the conductive layer includes a polysilicon layer.

A hard mask 24 is formed over the pad nitride-based layer. The pad nitride-based layer, the conductive layer, the gate insulation layer, and the substrate 20 are etched using the hard mask 24 to form trenches (not shown) having a certain depth. Thus, the gate insulation pattern 21, the conductive pattern 22, and the pad nitride-based pattern 23 are formed.

A first insulation layer 25 for forming an isolation structure is formed over the resultant structure and filled in a portion of the trenches. The first insulation layer 25 may include an oxide-based layer, a nitride-based layer, or a combination thereof for insulation. For instance, the first insulation layer 25 includes a high density plasma (HDP) oxide layer having a sufficient level of filling characteristic and a certain level of hardness to obtain a uniform polish characteristic during a chemical mechanical polish (CMP) process.

When the first insulation layer 25 includes a HDP oxide layer, the HDP oxide layer is formed to a thickness greater than a typical thickness, i.e., greater than approximately 1,000 Å, such that sidewalls of the gate insulation pattern 21 are not exposed. The first insulation layer 25 is formed to the increased thickness such that a thickness of a subsequent second insulation layer (refer to reference numeral 31 shown in FIG. 2E) for forming the isolation structure is minimized to uniformly control an effective field oxide height (EFH) of the isolation structure. That is, the thickness of the second insulation layer, i.e., a polish target layer, is minimized in this embodiment because EFH uniformity of the isolation structure deteriorates as a polished thickness increases, i.e., as a polished amount increases, during a chemical mechanical polish (CMP) process performed for planarization of the isolation structure.

Furthermore, the thickness of the first insulation layer 25 is increased to minimize a height difference of the HDP oxide layer between the cell region and the peripheral region during subsequent mask and etch processes. For instance, the mask and etch processes may include an etch process using a photoresist pattern exposing the cell region. That is, the HDP oxide layer is formed to a smaller thickness in the peripheral region when compared to the cell region because the peripheral region has a smaller pattern density than the cell region and a width of the trench in the peripheral region is larger than the cell region. Thus, the height difference of the HDP oxide layer between the cell region and the peripheral region may be minimized through securing the height of the HDP oxide layer in the peripheral region before the HDP oxide layer in the cell region is etched. This minimization of the height difference also contributes to securing the EFH uniformity of the isolation structure.

For instance, the HDP oxide layer is formed to a thickness ranging from approximately 2,000 Å to approximately 2,500 Å which is larger than the typical thickness. The HDP oxide layer may be formed to a thickness of approximately 2,000 Å using a chemical vapor deposition (CVD) method.

The first insulation layer 25 is cured to densify a layer property. Thus, a degree of hardness of the first insulation layer 25 may be increased. A bottom anti-reflective coating (BARC) layer 26 is formed over the first insulation layer 25. The BARC layer 26 functions as an etch barrier layer to prevent etching of the first insulation layer 25 formed below the BARC layer 26 during an etch process. The BARC layer 26 may include an inorganic-based anti-reflective coating layer or an organic-based anti-reflective coating layer.

The BARC layer 26 is used to fill spaces among portions of the first insulation layer 25 because the BARC layer 26 has a very low viscosity and a sufficient level of filling characteristic. At this time, the BARC layer 26 substantially fills the spaces among the portions of the first insulation layer 25 in the cell region having the high pattern density, but fills a portion of the space in the peripheral region having the lower pattern density than the cell region because the trench in the peripheral region has the large width. The first insulation layer 25 is formed in the trenches in a depressed form due to its characteristics, and the depressed portions are referred to as the spaces. Thus, the BARC layer 26 is formed in the peripheral region in a manner that portions of sidewalls of the trenches in the peripheral region are exposed.

Figure 2B:
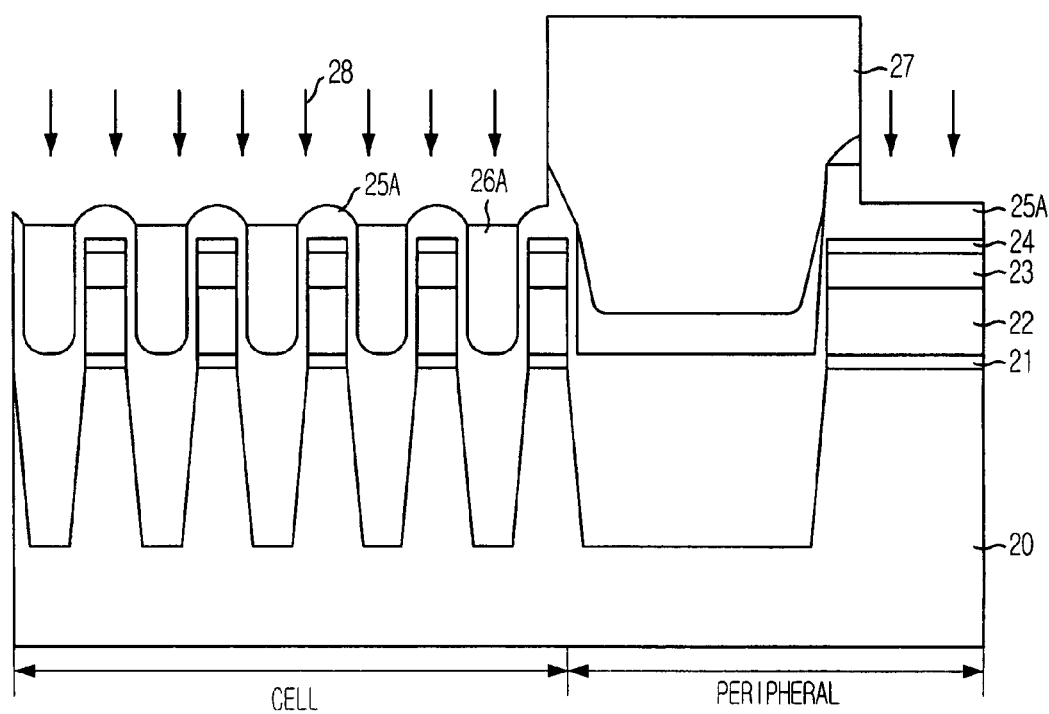

Referring to FIG. 2B, a photoresist pattern 27 is formed over the BARC layer 26 in a manner that the trench in the peripheral region is filled. The photoresist pattern 27 is formed to protect a region where the isolation structure will be formed in the peripheral region.

A dry etch process 28 is performed using the photoresist pattern 27 as a mask to etch the BARC layer 26 and the first insulation layer 25 to a certain thickness. Thus, an etched BARC layer 26A and an etched first insulation layer 25A are formed. For instance, approximately 1,500 Å of the BARC layer 26 and the first insulation layer 25 is removed. Thus, a thickness of the HDP oxide layer exposed over the hard mask 24, i.e., the etched first insulation layer 25A, is reduced in the cell region having the high pattern density through the dry etch process 28. Consequently, a process time for performing a subsequent wet etch process to expose portions of inner sidewalls of the trenches in the cell region may be minimized.

Figure 2C:
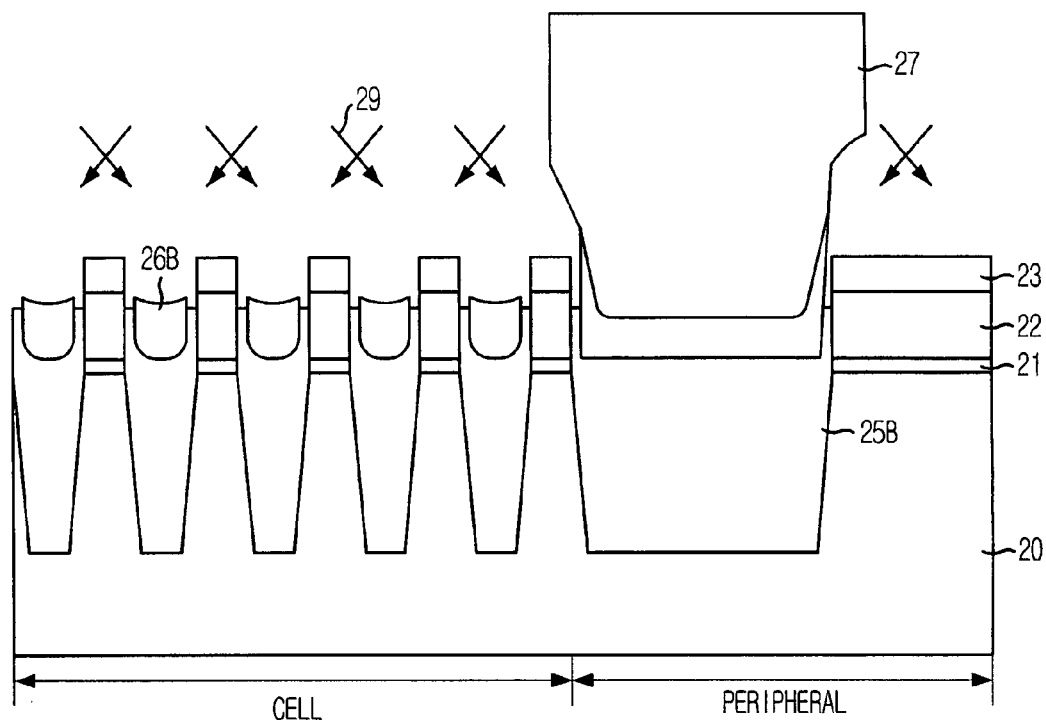

Referring to FIG. 2C, a first wet etch process 29 is performed using the photoresist pattern 27 as a mask to etch and remove a certain thickness of the etched first insulation layer 25A. Reference numeral 25B refers to a remaining first insulation layer 25B. Thus, portions of the inner sidewalls of the trenches in the cell region are exposed and a width of an upper opening portion of the trenches in the cell region is increased when compared to a typical process. Therefore, a filling characteristic of the subsequent second insulation layer for forming the isolation structure (refer to reference numeral 31 shown in FIG. 2E) may be improved.

Portions of the etched BARC layer 26A may be etched and removed during the first wet etch process 29. Reference numeral 26B refers to a remaining BARC layer 26B. The remaining BARC layer 26B functions as an etch barrier layer for the remaining first insulation layer 25B during the first wet etch process 29 and thus protects the remaining first insulation layer 25B formed below the remaining BARC layer 26B.

For instance, a process time of the first wet etch process 29 is controlled in a manner that approximately 1,500 Å of the etched first insulation layer 25A is removed using a BON ($H_2SO_4+H_2O_2$) solution. The hard mask 24 is removed during the first wet etch process 29.

Figure 2D:
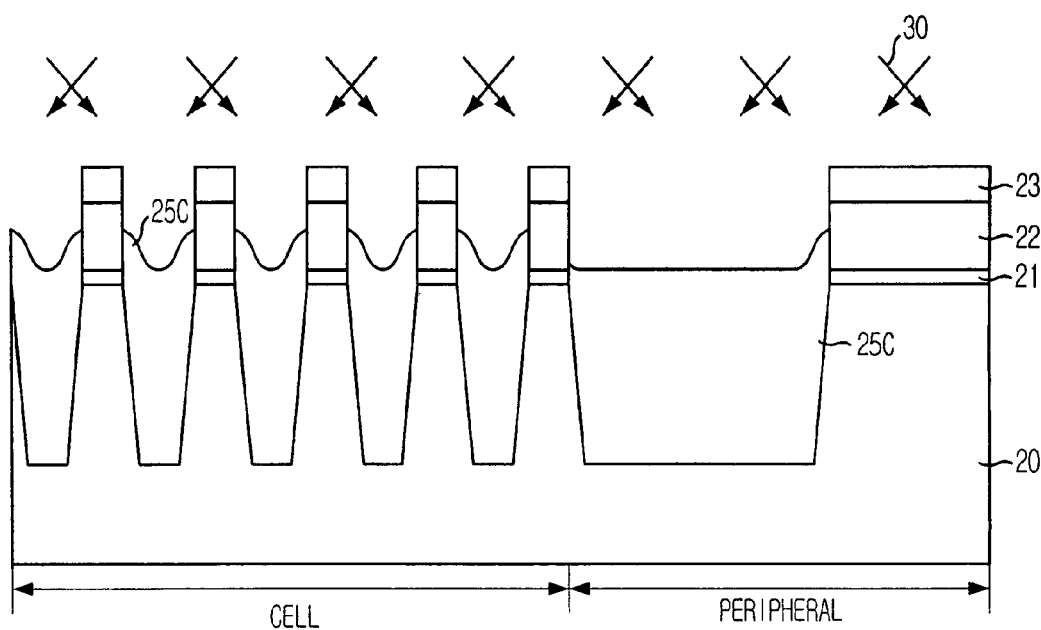

Referring to FIG. 2D, a removal process is performed to remove the photoresist pattern 27 (FIG. 2C). A second wet etch process 30 is performed without using a mask to remove the remaining BARC layer 26B (FIG. 2C). For instance, the wet etch process 30 uses a BON($H_2SO_4+H_2O_2$) solution. Portions of the remaining first insulation layer 25B may be etched during the wet etch process 30. Reference numeral 25C refers to a first insulation pattern 25C.

Figure 2E:
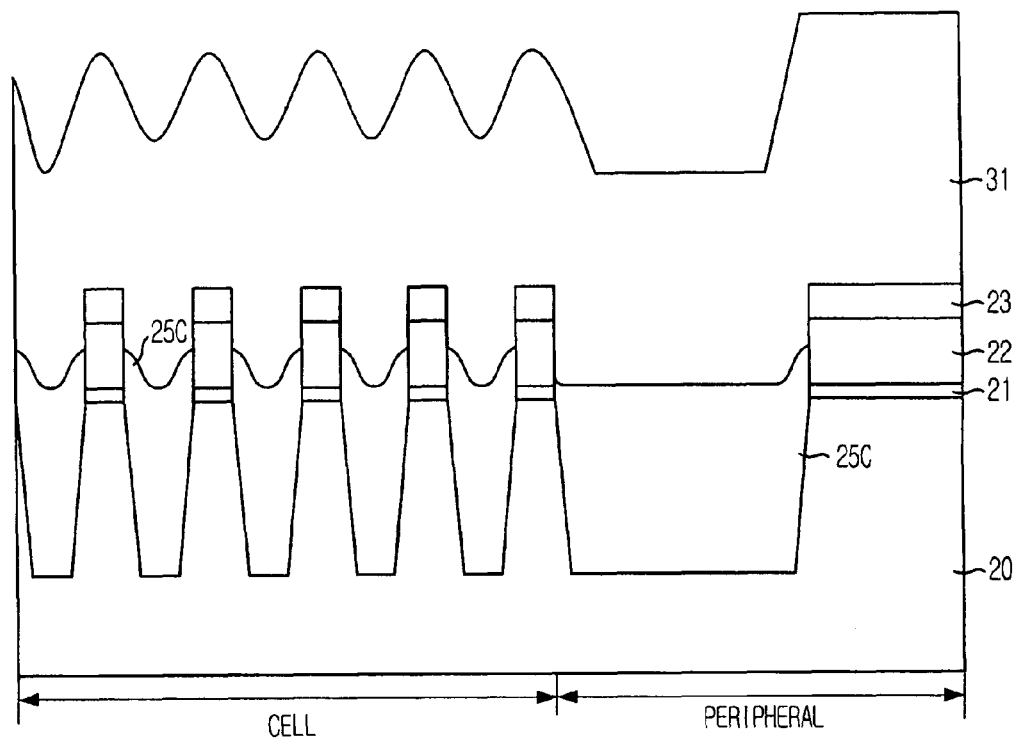

Referring to FIG. 2E, a second insulation layer 31 for forming the isolation structure is formed over the resultant structure and filled in the trenches. The second insulation layer 31 includes substantially the same material as the first insulation layer 25. The second insulation layer 31 may include an oxide-based layer, a nitride-based layer, or a combination thereof for insulation. For instance, the second insulation layer 31 includes a high density plasma (HDP) oxide layer having a sufficient level of filling characteristic and a certain level of hardness to obtain a uniform polish characteristic during a CMP process. The second insulation layer 31 is uniformly formed in the cell region without generating voids because the width of the upper opening portion of the trenches is increased in the cell region having the high pattern density.

In particular, the second insulation layer 31 is formed to a thickness smaller a typical thickness, i.e., smaller than approximately 3,500 Å. For instance, the second insulation layer 31 is formed to a thickness ranging from approximately 2,500 Å to approximately 3,000 Å. The second insulation layer 31 may be formed to a thickness of approximately 2,500 Å. The thickness of the second insulation layer 31, i.e., the polish target layer, is minimized to reduce the polished amount, securing uniformity in an EFH of the isolation structure. A curing process may be performed to densify a layer property of the second insulation layer 31.

Figure 2F:
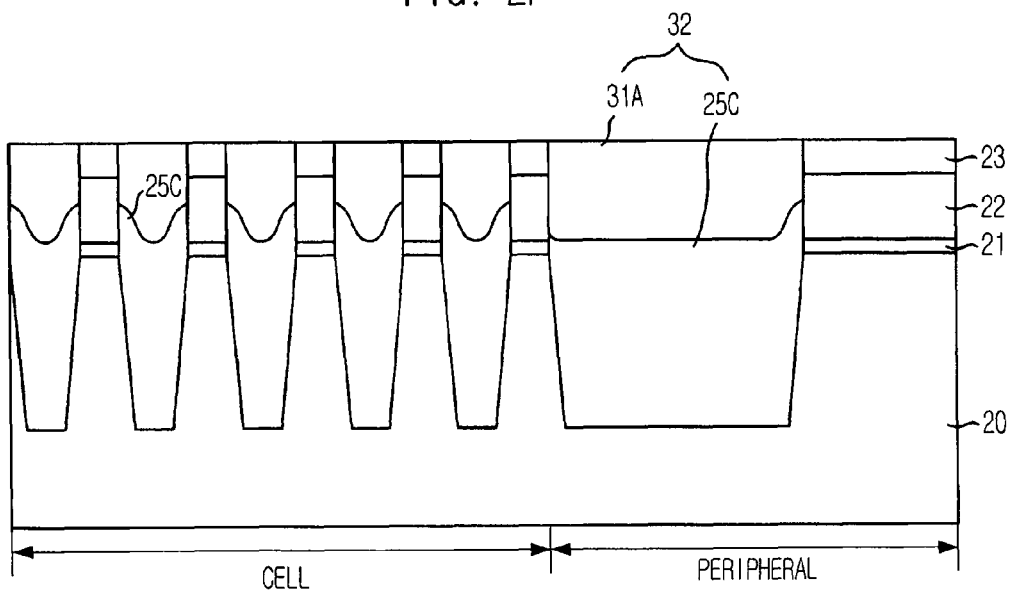

Referring to FIG. 2F, a planarization process, e.g., a CMP process, is performed on the second insulation layer 31 to expose upper surfaces of the pad nitride-based pattern 23. Reference numeral 31A refers to a second insulation pattern 31A. Thus, a single layer of HDP oxide including substantially the same material is formed in the cell region and the peripheral region, generating a uniformly formed isolation structures 32 without voids. Although not shown, another wet etch process using a phosphoric acid is performed to remove the pad nitride-based pattern 23.

In accordance with the embodiment of the present invention, the isolation structure in a highly integrated semiconductor device may be uniformly formed without generating voids using a single layer of HDP oxide layer. Also, the uniformity of the EFH of the isolation structure may be secured.

In accordance with the embodiment of the present invention, various benefits may result as follows. The width of the upper opening portion of the trench is selectively increased by: forming the trench; forming the first insulation layer filling a portion of the trench; forming the etch barrier layer filled in spaces between portions of the first insulation layer; and selectively etching the first insulation layer exposed by the etch barrier layer to expose a portion of the inner sidewalls of the trench. Thus, a filling characteristic of the subsequent second insulation layer may be improved, and consequently, a uniformly formed isolation structure may be formed without voids.

Also, it may be easy to control processes when fabricating a device because the isolation structure is formed using a single layer of HDP oxide layer which is a verified material. Further, forming the first insulation layer to a thickness greater than that used in a typical process allows forming the subsequent second insulation layer to a thickness smaller than that used in the typical process. Consequently, the polished amount of the second insulation layer, i.e., the polish target layer, is minimized during the subsequent CMP process. Therefore, the EFH of the isolation structure may be uniformly controlled.

Portions of the HDP oxide layer in the cell region are selectively etched using the photoresist pattern having a structure that exposes the cell region after forming the first insulation layer having the large thickness. Thus, the height difference of the isolation structure between the cell region and the peripheral region may be minimized. Therefore, the EFH uniformity of the isolation structure may be secured.

While the present invention has been described with respect to the exemplary embodiments, it will be apparent to those skilled in the art that various changes and modifications may be made without departing from the spirit and scope of the invention as defined in the following claims. Furthermore, the embodiments of the present invention may be well applied in a flash memory device using a self-aligned shallow trench isolation (SA-STI) process or an advanced SA-STI (ASA-STI) process. This is because an aspect ratio of a trench in which an isolation structure is to be filled increases much more when the SA-STI or ASA-STI process is applied than when a typical STI process is applied. In particular, an aspect ratio of a trench further increases in an ASA-STI structure because one conductive layer having a large thickness is formed for forming a floating gate. Thus, the embodiment of the present invention may be well applied in the ASA-STI structure.

What is claimed is:

1. A method for forming an isolation structure in a semiconductor device, wherein the semiconductor device includes a substrate comprising a first region and a second region, the second region having an isolation structure formed to a larger width than a plurality of isolation structures formed in the first region, the method comprising:

etching portions of the first and second regions of the substrate to form first and second trenches, respectively, wherein a width of the second trench is larger than that of the first trench;

forming a first insulation layer to fill a portion of the first and second trenches;

directly after forming the first insulation layer, forming a barrier layer over the first insulation layer;

etching portions of the first insulation layer and the barrier layer;

removing the barrier layer; and forming a second insulation layer over the first insulation layer to fill the first and second trenches, wherein the barrier layer is foamed to have a smaller thickness in the second region than in the first region, wherein etching portions of the first insulation layer and the barrier layer in the first region comprises:

forming a photoresist pattern over the barrier layer of the second trench; and performing a first etch process to etch the portions of the first insulation layer and the barrier layer in the first region using the photoresist pattern.

2. The method of claim 1, further comprising, after performing the first etch process, performing a second etch process to etch portions of the first insulation layer and the barrier layer using the photoresist pattern such that a portion of inner sidewalls of the first trenches is exposed.

3. The method of claim 2, wherein the second etch process is performed under a certain condition to etch the first insulation layer, wherein the second etch process comprises etching the barrier layer at a lower rate than the first insulation layer while the first insulation layer is etched.

4. The method of claim 2, wherein the first etch process comprises performing a dry etch process and the second etch process comprises performing a wet etch process.

5. The method of claim 1, wherein the barrier layer comprises a material having a different etch rate than the first insulation layer under substantially the same etch condition.

6. The method of claim 1, wherein the barrier layer comprises one of an inorganic-based anti-reflective coating layer and an organic-based anti-reflective coating layer.

7. The method of claim 1, wherein the first and second insulation layers comprise substantially the same material.

8. The method of claim 7, wherein the first and second insulation layers comprise a high density plasma (HDP) oxide layer.

9. The method of claim 1, wherein removing the barrier layer comprises performing a wet etch process.

10. The method of claim 1, wherein the first insulation layer has depressed portions above middle portions of the first and second trenches.

11. The method of claim 10, wherein the barrier layer substantially fills the depressed portions of the first insulation layer.

12. The method of claim 1, further comprising, after forming the first insulation layer, performing a curing process on the first insulation layer to densify a layer property of the first insulation layer.

13. The method of claim 1, further comprising, after forming the second insulation layer, performing a curing process on the second insulation layer to densify a layer property of the second insulation layer.

14. The method of claim 1, further comprising, prior to etching the portions of the first and second regions of the substrate to form the first and second trenches, forming a structure over the substrate to be patterned while etching the portions of the first and second regions of the substrate to form the first and second trenches.

15. The method of claim 14, wherein forming the structure comprises:

forming a gate insulation layer over the substrate;

forming a conductive layer for forming a gate electrode over the gate insulation layer; and forming a padding layer over the conductive layer.

16. The method of claim 15, further comprising, after forming the second insulation layer, planarizing the second insulation layer to expose an upper portion of the structure.

17. The method of claim 15, wherein the padding layer comprises a nitride-based layer.

18. The method of claim 1, wherein the first region comprises a cell region and the second region comprises a peripheral region.

* * * * *